United States Patent [19]

Erikson et al.

[11] 4,224,504
[45] Sep. 23, 1980

[54] APPARATUS FOR PRACTICING TEMPERATURE GRADIENT ZONE MELTING

[75] Inventors: Carl A. Erikson; Thomas R. Anthony; Harvey E. Cline, all of Schenectady; Siegwalt Ludke, Scotia; John O. Fielding, Ballston Lake, all of N.Y.

[73] Assignee: General Electric Company, Schenectady, N.Y.

[21] Appl. No.: 917,492

[22] Filed: Jun. 21, 1978

Related U.S. Application Data

[63] Continuation of Ser. No. 796,368, May 12, 1977, abandoned.

[51] Int. Cl.³ .......................... B25J 15/06; F27B 9/06
[52] U.S. Cl. .................................. 219/388; 219/354; 219/405; 219/411; 432/120; 432/231
[58] Field of Search .................. 432/227, 86, 87, 121, 432/230, 231; 219/411, 10.69, 405, 10.73, 10.79, 385, 85 G, 85 CA, 85 D, 85 F, 58, 345, 354; 13/20; 214/1 BH, 1 BT; 271/5, 14, 98, 105; 148/171

[56] References Cited

U.S. PATENT DOCUMENTS

| | | | |
|---|---|---|---|
| 2,881,929 | 4/1959 | Giffen | 214/1 BS |
| 3,209,923 | 10/1965 | Bargel et al. | 198/486 |
| 3,476,632 | 11/1969 | Cornelius | 214/1 BS |
| 3,666,907 | 5/1972 | Nugent et al. | 219/85 BA |
| 3,891,205 | 6/1975 | Sunahara et al. | 271/98 |
| 4,002,246 | 1/1977 | Brandt et al. | 214/1 BH |
| 4,097,226 | 6/1978 | Erikson et al. | 219/343 |

FOREIGN PATENT DOCUMENTS

710487  6/1954  United Kingdom ...................... 271/26

Primary Examiner—Elliot A. Goldberg
Assistant Examiner—Bernard Roskoski
Attorney, Agent, or Firm—Donald M. Winegar; James C. Davis, Jr.; Leo I. MaLossi

[57] ABSTRACT

An apparatus for practicing temperature gradient zone melting simultaneously on a plurality of semiconductor bodies comprises a closable work chamber for receiving the bodies for processing; a heat source disposed in the work chamber and comprising a first closure member thereof; a heat sink disposed in the work chamber and comprising a second closure member thereof and means for transferring one or more bodies of semiconductor material to the work chamber for processing and from the work chamber subsequent to processing. The transferring means comprises manipulative means for selectively engaging the semiconductor bodies and supporting the bodies in transit and drive means for moving the manipulative means toward and away from the work chamber and orienting the manipulative means with respect to the semiconductor bodies.

23 Claims, 5 Drawing Figures

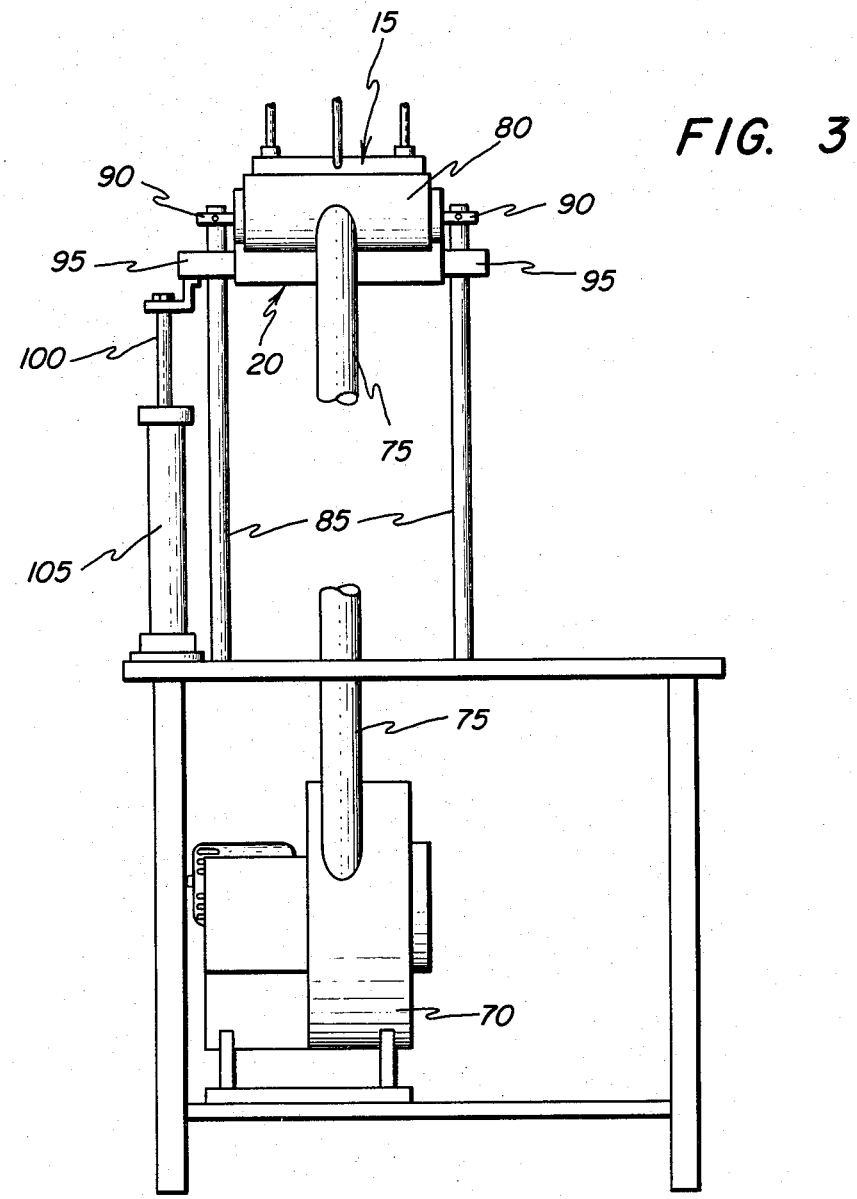

APPARATUS FOR PRACTICING TEMPERATURE GRADIENT ZONE MELTING

This is a continuation, of application Ser. No. 796,368, filed May 12, 1977, now abandoned.

CROSS REFERENCES

This invention relates to the following U.S. Pat. applications assigned to the assignee of the present invention:

Patent application Ser. No. 735,512, filed Oct. 26, 1976, now U.S. Pat. No. 4,101,759 in the names of Thomas R. Anthony, Harvey E. Cline, John O. Fielding and Carl A. Erikson, and entitled "Semiconductor Body Heater" which discloses and claims a new and improved heat source for the practice of temperature gradient zone melting;

Patent application Ser. No. 735,513, filed Oct. 26, 1976 now U.S. Pat. No. 4,097,226 in the names of Harvey E. Cline, John O. Fielding, Carl A. Erikson and Thomas R. Anthony and entitled "Furnace For Practising Temperature Gradient Zone Melting" which discloses and claims a new and improved apparatus for maintaining a uniform temperature gradient across a plurality of bodies undergoing processing by temperature gradient zone melting and Patent application Ser. No. 796,367, now abandoned, filed the same date as this patent application in the names of John O. Fielding, Carl A. Erikson, Thomas R. Anthony, Harvey E. Cline and Siegwalt Ludke and entitled "Apparatus For Practising Temperature Gradient Zone Melting" which discloses and claims an apparatus for an automated practice of temperature gradient zone melting, now abandoned in favor of application Ser. No. 917,493.

BACKGROUND OF THE INVENTION

1. Field of the Invention

This invention relates to an apparatus for practising temperature gradient zone melting and more specifically an apparatus for an automated practice of temperature gradient zone melting.

2. Description of the Prior Art

In the manufacture of semiconductor devices, it is often necessary to alter or tailor the conductivity type of a body of semiconductor material. This alteration is achieved by distributing atoms of a conductivity modifying dopant in a selected region or selected regions of the body. Frequently, techniques employed to achieve that distribution require the heating of the semiconductor body.

Recently, it has been discovered that a preferred technique of altering the conductivity of a semiconductor body is the technique of temperature gradient zone melting. Early teachings of temperature gradient zone melting are found in U.S. Pat. No. 2,813,048 issued to W. G. Pfann and in a book by Pfann entitled *Zone Melting* (John Wiley and Sons, Inc., 1966). More recent applications of temperature gradient zone melting are disclosed and claimed in U.S. Pat. Nos. 3,899,361 and 3,899,362 to Thomas R. Anthony and Harvey E. Cline and assigned to the same assignee of the present invention. The aforementioned patents to Anthony and Cline are incorporated herein by reference. As taught in the aforementioned book by Pfann, temperature gradient zone melting involves the migration of a melt of a first material through a body of a second material under the influence of a temperature gradient maintained across the second material and finally a recrystallization of the melt after migration. In the application of temperature gradient zone melting to the production of semiconductor devices, the first material usually comprises a metal such as aluminum, tin-aluminum alloy or gold-antimony alloy while the second material comprises a semiconductor material such as silicon, germanium or the like.

In his copending U.S. Pat. application Ser. No. 578,736, filed May 19, 1975, U.S. Pat. No. 4,041,278, and entitled "Heating Apparatus For Temperature Gradient Zone Melting" John Boah discloses a furnace suitable for the manufacture of semiconductor devices by temperature gradient zone melting. However, it was found that the Boah apparatus could be improved upon in a number of respects. A new and improved heater useful in such a furnace is disclosed and claimed in the aforementioned U.S. Pat. No. 4,101,759 incorporated herein by reference. This heater provides a heat output capability commensurate with a large scale commercial manufacture of semiconductor devices, the temperature gradient across an array of semiconductor devices heated by this heater being of a uniformity sufficient to ensure consistency in the simultaneous production of a plurality of semiconductor devices.

Another furnace suitable for processing semiconductor bodies by temperature gradient zone melting is disclosed and claimed in U.S. Pat. No. 4,097,226 previously cited and incorporated herein by reference. This furnace is particularly well suited for a large scale manufacture of semiconductor devices by temperature gradient zone melting due to its simplicity of construction, potential for accommodating a large number of semiconductor bodies simultaneously and the accessibility of the work chamber or interior of the furnace by automated loading and unloading apparatus.

Large scale commercial manufacture of semiconductor devices necessarily requires automated apparatus for the transfer of semiconductor bodies from one work station to a successive station. Therefore, such a commercial manufacture of semiconductor devices by temperature gradient zone melting, requires automated apparatus for the loading of semiconductor wafers from the furnace. To optimize the processing, such a loading and unloading should be accomplished as rapidly and simply as possible.

The semiconductor wafers, before being loaded into the furnace, have undergone considerable processing which may include, among others, the processing steps of selective coating, metallization, impurity introduction, selective removal of surface materials and cleaning, each process adding to the value of the wafers. The wafers are generally quite brittle and of a typical thickness of only 6 to 12 mils making the wafers quite fragile. Therefore, any apparatus for the automated loading of wafers into a furnace and unloading from a furnace must carry out these functions without damaging the valuable yet fragile wafers.

Accordingly, it is an object of the present invention to provide an apparatus for practising temperature gradient zone melting which overcomes the deficiencies of the prior art.

It is another object of the present invention to provide an apparatus for the practise of temperature gradient zone melting wherein semiconductor wafers are loaded into and unloaded from a furnace in a simple manner requiring a minimal amount of time.

It is another object of the present invention to provide an apparatus for the practise of temperature gradient zone melting wherein semiconductor wafers are loaded into and unloaded from a furnace with only minimal risk of damaging the wafers.

SUMMARY OF THE INVENTION

These and other objects apparent from the following detailed description taken in connection with the appended claims and accompanying drawings are attained by providing an apparatus for practising temperature gradient zone melting which includes a work chamber, a heat source disposed in the work chamber and comprising a first closure member thereof; a heat sink disposed in the work chamber and comprising a second closure member thereof and means for transferring one or more bodies of semiconductor material to the work chamber for processing and from the work chamber subsequent to processing. The closure members are mutually separable by a first actuator such as for example a hydraulic actuator. The transferring means comprises manipulative means for selectively engaging the bodies and supporting the bodies in transit and drive means for moving the manipulative means toward and away from the work chamber and orienting the manipulative means with respect to the semiconductor bodies and other work stations. The manipulative means include a plurality of vacuum lines each terminating in a vacuum cup for attaching to and supporting a semiconductor wafer. The manipulative means also includes a second actuator such as for example a hydraulic actuator for bringing the vacuum cups into engagement with the semiconductor wafers. Actuators such as hydraulic actuators are provided in the drive means to rectilinearly and pivotally propel the manipulative means to orient the manipulative means with respect to the stations of the work chamber, a semiconductor body storing means and a semiconductor body receiving means. The storing means includes at least one gas nozzle, fluid issuing therefrom serving to separate adjacent wafers in a stack to ensure that the transferring means removes only a single wafer at a time from the stack.

BRIEF DESCRIPTION OF THE DRAWINGS

FIG. 3 is an end view of a furnace employed in the present invention with means for transferring semiconductor bodies to and from a work chamber removed for clarity.

DESCRIPTION OF THE PREFERRED EMBODIMENT

Figure 4:
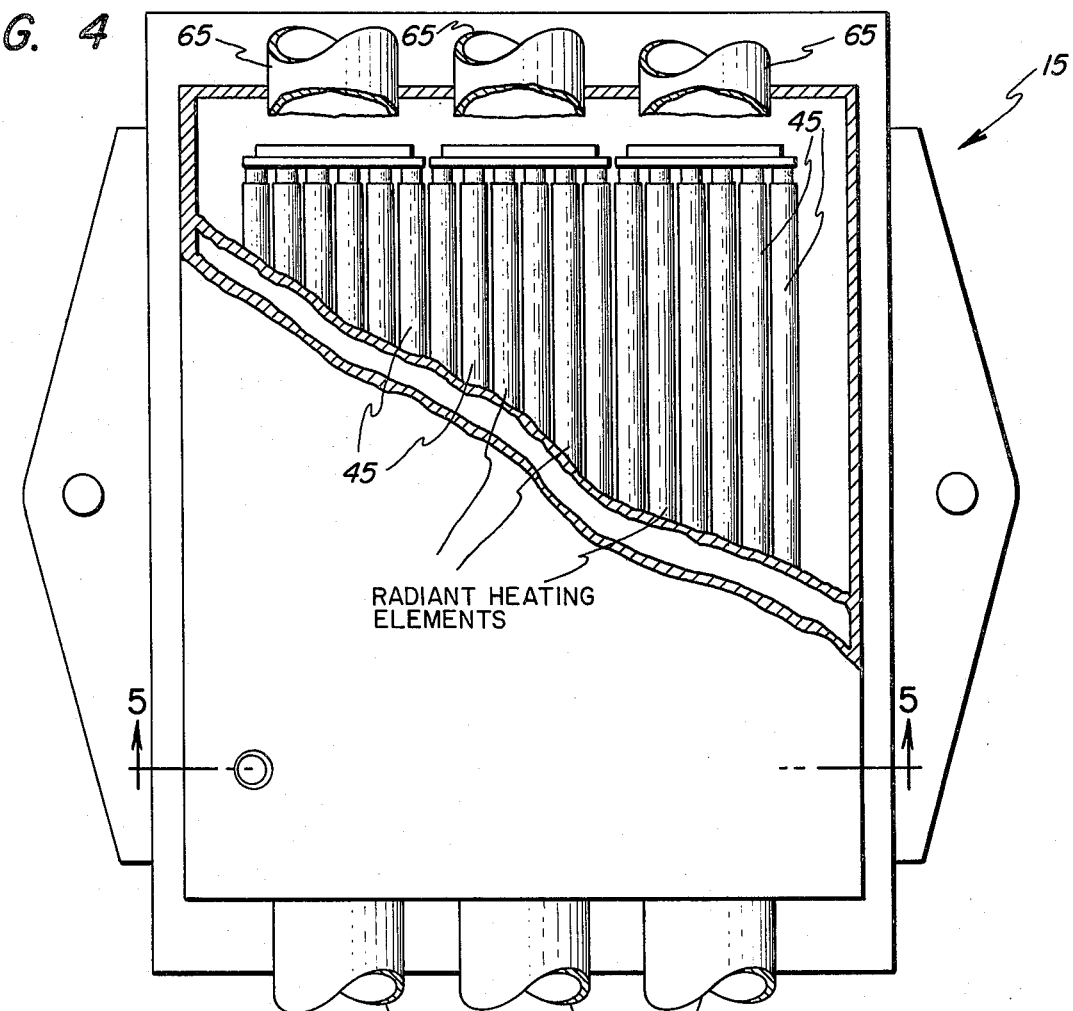
FIG. 4 is a top view partially sectioned and broken away of a heat source employed in the apparatus of the present invention.
Figure 5:
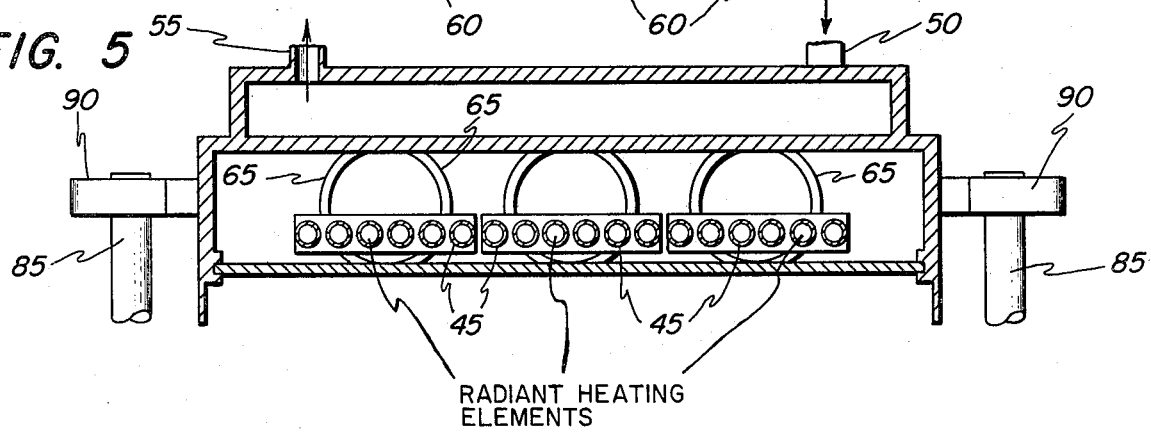
FIG. 5 is a sectional view taken along line 5—5 of FIG. 4.

Referring to the drawings, there is shown a new and improved apparatus 10 for practising temperature gradient zone melting. Apparatus 10 includes a heat source or first closure member 15 and a heat sink or second closure member 20 which when disposed adjacent each other define in part a closable work chamber 25 which receives semiconductor bodies or wafers 30 for the processing thereof by temperature gradient zone melting. Heat source 15 and heat sink 20 face internally of the work chamber. Wafers 30 are disposed on supports 32 within work chamber 25. Heat sink 20 is internally cooled by a flow of coolant therethrough, the coolant being supplied to the heat sink through pipe 35 and drained from the heat sink through pipe 40. Heat source 15 comprises a plurality of radiative heating elements 45 which in the preferred embodiment comprises tungsten filament, quartz halogen lamps which upon proper energization emit infrared radiation of a temperature as great as 3000° C. (see FIG. 4). Electrical connections are made to the lamps through power line 47. Heat source 15 is cooled by a flow of liquid coolant supplied thereto through pipe 50 and drained therefrom through pipe 55. The heat source is also cooled by a flow of coolant gas over the lamp envelopes, the coolant gas being supplied to the heat source through supply tubes 60 and exhausted from the heat source to ambient through exhaust tubes 65. In the preferred embodiment, the coolant gas comprises compressed air which is pressurized by blower 70 the air being conducted to pipes 60 through blower outlet pipe 75 and manifold 80. Heat source 15 is fixed to upstanding rails 85 at locations 90.

Heat sink 20 includes bearings 95 in which rails 85 are slidably received. Heat sink 20 is fixed to a piston rod 100 (FIG. 3) of a suitable actuator 105, the actuator providing movement of heat sink 20 or rails 85 to effect the opening and closing of work chamber 25. It has been found that actuators of the hydraulic, pneumatic or hydro-pneumatic variety are particularly well suited for this application. Details of construction of the heat source and heat sink are found in the aforementioned U.S. Pat. applications Ser. Nos. 735,512 and 735,513 and form no part of the present invention.

Again referring to FIG. 1, means are provided for storing semiconductor bodies 30 prior to the transfer of the bodies to work chamber 25. This storing means comprises at least one supporting base 115 having a plurality of guides 120 extending from a major surface thereof, the guides serving to maintain the alignment of stacks 125 of semiconductor bodies 30. Each of bases 115 is biased upwardly toward a stack disposed thereon by a spring 130. In the preferred embodiment five of such supporting bases are employed to support five stacks of semiconductor wafers. Therefore, as will be described hereinafter, an array of five semiconductor wafers is transferred to working chamber 25 at once. However, this number of supporting bases and stacks of semiconductor wafers is shown for illustrative purposes only and more or less of such supporting bases may be used as required.

As will be shown hereinafter, the apparatus of the present invention is provided with means for transferring a single semiconductor wafer from each of stacks 125 to work chamber 25 at one time. To ensure that only one wafer is transferred from each stack, i.e., to prevent the top two wafers from sticking together, means for separating the semiconductor wafers from each other while stacked are provided and comprise at least one gas nozzle 135 disposed in proximity to each of stacks 125, the gas nozzles each directing a jet of gas at the top two or more wafers as the top wafer is lifted from the stack in its transferral to work chamber 25. In the preferred embodiment, compressed air is supplied to nozzles 135 from pipe 140 adapted for communication with a suitable source of compressed air (not shown).

The apparatus of the present invention is further provided with another station comprising means 142 for receiving semiconductor wafers from work chamber 25 subsequent to processing therein. For clarity, these means are not illustrated in FIG. 1 but shown in FIG. 2 and comprise at least one supporting base 145 having a plurality of guides 150 disposed thereon. In the preferred embodiment, four such guides provide a receptacle for a stack of semiconductor wafers.

Figure 2:
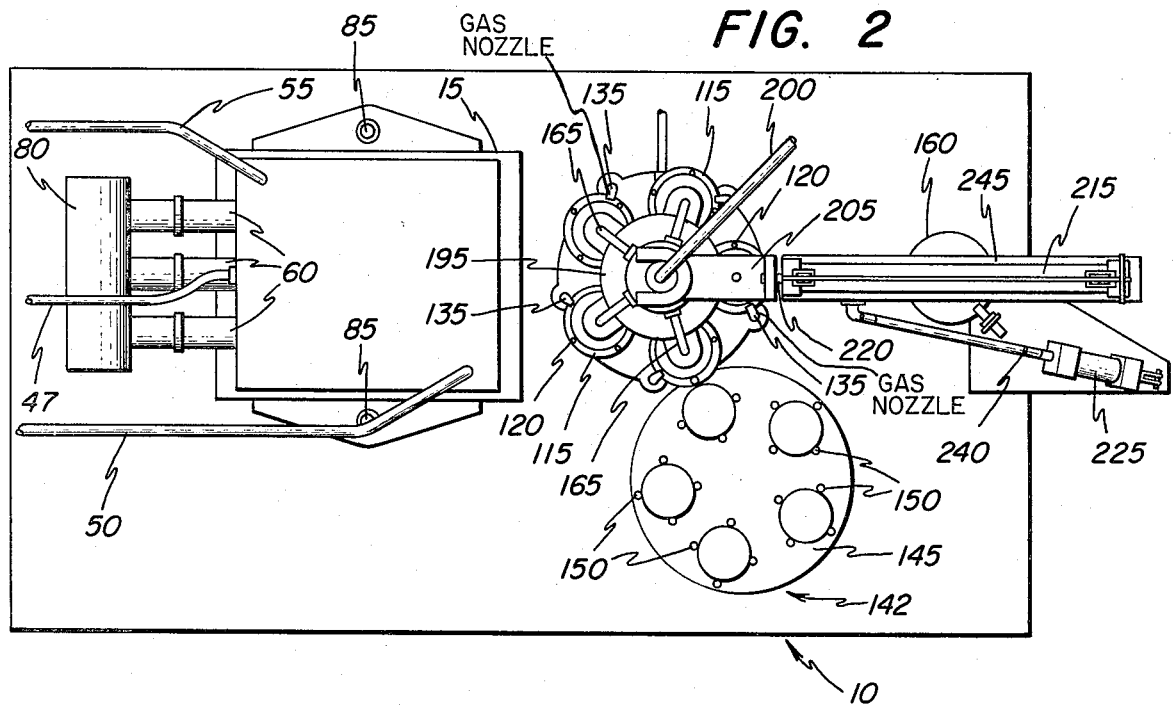
FIG. 2 is a top view of the apparatus of the present invention.
Figure 1:
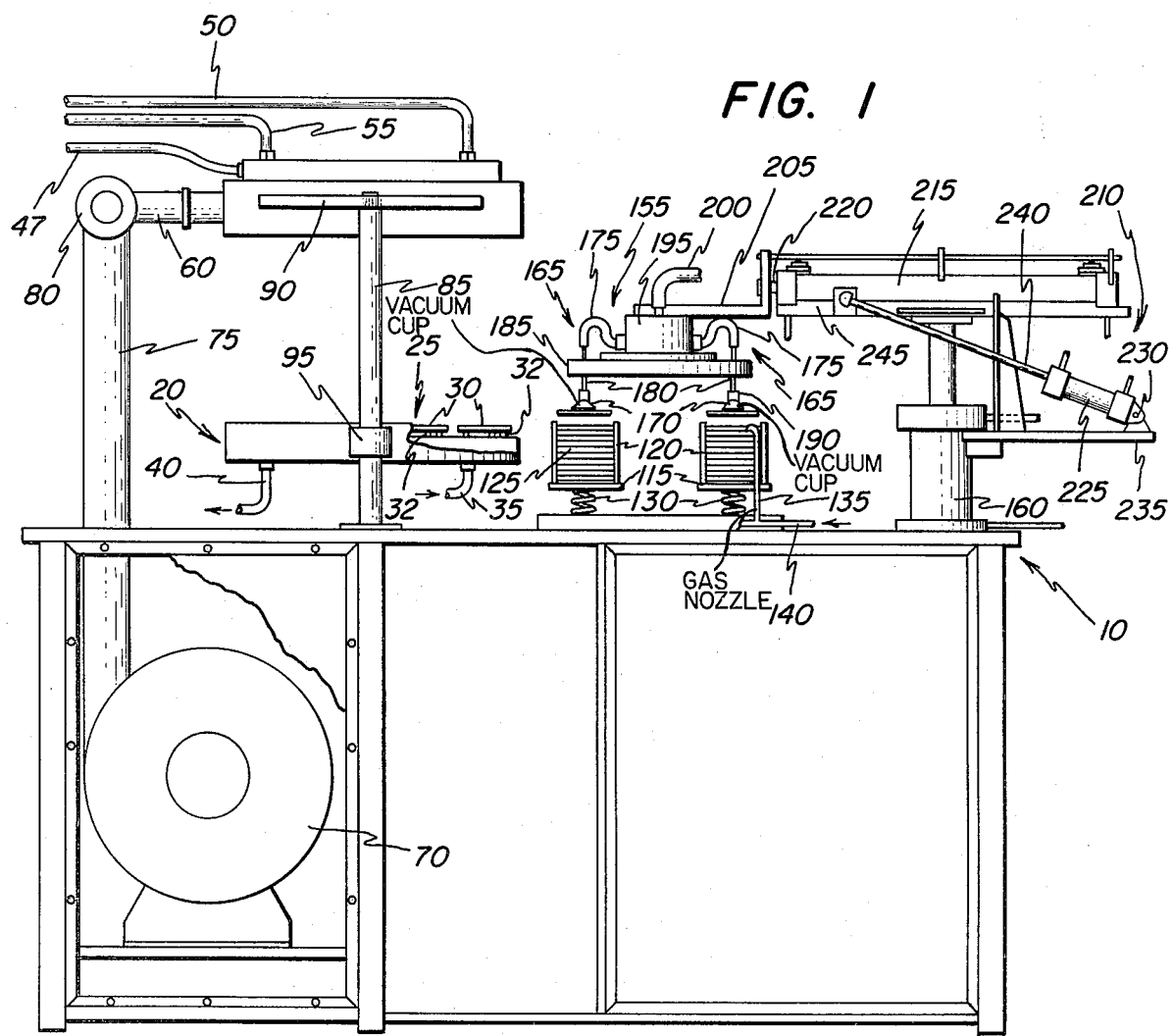
FIG. 1 is a side view of the apparatus of the present invention.

To provide for the rapid transfer of a plurality of semiconductor wafers to work chamber 25 in a safe manner, the apparatus of the present invention is provided with means for transferring one or more bodies of semiconductor material to the work chamber for processing and from the work chamber subsequent to processing. The transferring means comprises a manipulative means for selectively engaging and supporting the bodies of semiconductor material in transit and drive means for moving the manipulative means toward and away from the work chamber and orienting the manipulative means with respect to the semiconductor bodies and other work stations. Referring to FIGS. 1 and 2, the manipulative means comprises a device 155 for selectively attaching to the top semiconductor wafer in each of stacks 125 and a second actuator 160 for placing the attaching means in contact with the top semiconductor wafers simultaneously. The attaching means comprises a plurality of vacuum lines 165 each terminating in a vacuum cup 170 at an end of the vacuum line each vacuum cup being engageable with a corresponding semiconductor wafer and attachable thereto through suction. Each vacuum line comprises a flexible portion 175 in communication with a rigid end portion 180 which is slidably received within a vacuum line guide 185. Each of the vacuum cups is fixed to and in fluid communication with rigid ends 180 and is biased toward stacks 125 of semiconductor wafers by a weight 190 fixed to rigid end portion 180. Each vacuum line 165 is connected to and in fluid communication with a manifold 195 which has a vacuum applied thereto through pipe 200. Manifold 195 is fixed to a manifold support 205 which is movable in a vertical direction by actuator 160 for raising and lowering the attaching means at a series of stations.

To propel manipulative means 155 in rectilinear and pivotally in arcuate directions drive means 210 are provided. This drive means sequentially moves manipulative means 155 from the semiconductor wafer storage means to the work chamber, from the work chamber to the semiconductor body receiving means, and from semiconductor body receiving means back to semiconductor body storing means. To move manipulative means in a rectilinear direction, drive means 210 is provided with a third actuator 215 having a piston shaft 220 to which manifold support 205 is affixed. In the configuration of the apparatus shown in FIGS. 1 and 2, extension of piston shaft 220 will move attaching means 155 from above the semiconductor wafer storing means to the interior of work chamber 25. A retraction of piston rods 20 sill move attaching means 155 from the interior of work chamber 25 to a position above the semiconductor wafer storing means.

To pivotally propel attaching means 155 in an arcuate direction, a fourth actuator 225 is provided, being fixed at 230 to a stationary support 235 and having a piston shaft 240 fixed to a mount 245 for third actuator 215. Retraction of piston rod 240 by fourth actuator 225 will cause attaching means 155 to swing from a position over the semiconductor wafer storage means to a position over the semiconductor wafer receiving means (see FIG. 2). Actuators 160, 215 and 225 like first actuator 105 may be of the hydraulic, pneumatic, or hydropneumatic variety well known to those skilled in the art.

Operation

In operation, attaching means 155 and vacuum cups 170 are lowered into contact with the uppermost semiconductor wafers in stacks 125 by actuator 160. A vacuum is applied to the cups through pipe 200 and manifold 195 and actuator 160 and lifts the attaching means so that the uppermost wafer in each stack is lifted off of the stack. Air jets from nozzles 135 prevent the second uppermost wafer in each stack from sticking to the first. With the attaching means in this position, actuator 215 moves the attaching means and the semiconductor wafers into the work chamber 25, while the closure members 15 and 20 are separated. Actuator 160 then lowers attaching means 155 so that the wafers held by vaccum cups 170 rest on supports 32. The vacuum is then removed from vacuum lines 165 releasing wafers 30 and attaching means 155 is raised and moved out of work chamber 125 by actuators 160 and 215 respectively. Actuator 105 then closes work chamber 25 by moving second closure member 20 upwardly until it contacts first closure member 15 as shown in FIG. 3. After processing for a required length of time by temperature gradient zone melting, actuator 105 lowers second closure member 20 opening work chamber 25. As previously described, actuators 160 and 215 propel attaching means 155 into work chamber 25 to pick up and remove the semiconductor wafers therefrom. Next, these two actuators propel the attaching means and the processed wafers out of the work chamber into the position occupied in FIGS. 1 and 2. Thereafter, piston rod 240 is retracted by actuator 225 so that the attaching means and the processed wafers are swung into a position immediately above the semiconductor wafer receiving means 142. Actuator 160 lowers attaching means 155 and the vacuum is removed from the vacuum cups causing the processed wafers to be placed gently on the semiconductor wafer receiving means. Piston rod 240 is then extended by actuator 225 swinging attaching means 155 into a position above the storing means (see FIGS. 1 and 2), the position of the attaching means at the start of the cycle. The attaching means is then lowered to pick up the uppermost wafers of stacks 125 and the cycle is repeated.

It can be seen then, that the apparatus for practising temperature gradient zone melting of the present invention provides a means by which semiconductor wafers may be rapidly loaded into and unloaded from a furnace or work chamber in a simple manner requiring only three actuators of well known varieties to accomplish that loading and unloading. The actuators position the attaching means precisely in locations where the semiconductor wafers are to be either picked up or deposited thereby preventing damage to the wafers.

The functioning of the apparatus of this invention is adaptable for control by a logic circuit means or system such, for example, as one or more large scale integrated circuits or a microprocessor. Such a logic system embodies a monitoring system for detecting the presence or absence of heat, cooling water, vacuum, cooling air and air for separating the wafers for loading. In particular, the logic system controls the power to the heat source in order to provide a predetermined time-temperature profile for processing the wafers in the apparatus. This enables one to optimize the wafer yield and wafer throughput to minimize process costs and to maximize the conservation of energy. Other detecting systems can be embodied in such a logic system for sensing the operative state of the power supply, transfer mass, oven, wafer supply, and the like. The logic system is also employed to control the operating sequence of the furnace apparatus and to initiate an alarm signal to alert the operator whenever a faculty operating condition is detected and to automatically terminate furnace operation safely in a preplanned sequence operation without damage to the furnace components and to achieve the highest possible processed wafer yields.

While there has been shown and described a specific embodiment of the apparatus of the present invention it will be apparent to those skilled in the art that modifications may be made without departing from the substance of the invention and it is intended by the appended claims to cover such modifications as come within the spirit and scope of this invention.

We claim as our invention:

1. An apparatus for the simultaneous processing of one or more bodies of semiconductor material by temperature gradient zone melting, said apparatus comprising:
   a closable work chamber for receiving said semiconductor bodies for processing and including a first closure member and a second closure member;
   said first closure member having a radiative heating element heat source facing internally of said work chamber for heating said semiconductor bodies;
   said second closure member including a heat sink facing internally of said chamber and located opposite to said heat source, said heat sink cooperating with said heat source to produce a relatively uniform temperature gradient within said bodies of semiconductor material;
   said closure members defining at least in part said work chamber and at least one of said closure members being movable to allow access to the interior of said work chamber;
   means disposed in said work chamber for supporting said bodies of semiconductor material during processing;
   first means for storing bodies of semiconductor material prior to processing in said closable work chamber;
   second means for storing bodies of semiconductor material after processing in said closable work chamber;
   a first actuation means for providing relative movement between said first and said second closure members to effect the opening and closing of said work chamber;
   means for transferring one or more bodies of semiconductor material from said first storage means to said closable work chamber, for disposing said one or more bodies on said supporting means, and for transferring said one or more bodies from said supporting means to said second storage means;
   manipulative means for selectively engaging and supporting said bodies of semiconductor material during a transferring sequence, said manipulative means comprising
   (1) means for selectively attaching to said bodies of semiconductor material, and
   (2) a second actuation means for placing said attaining means in contact with said bodies of semiconductor material;
   drive means for moving said manipulative means toward and away from a plurality of stations including the interior of said closable work chamber, said first storage means, and said second storage means,
   said drive means comprising
   (1) means including a third actuation means for propelling said manipulative means in a rectilinear direction, and
   (2) means including a fourth actuation means for pivotally propelling said manipulative means in an arcuate direction.

2. The apparatus of claim 1 wherein
said first closure member is stationary, and
said second closure member is movable by said first actuation means into and out of closing engagement with said first closure member.

3. The apparatus of claim 1 wherein
said first, said second, said third and said fourth actuation means includes an actuator which is one selected from the group consisting of a hydraulic actuator, a pnuematic actuator, and a hydraulic-pneumatic actuator.

4. The apparatus of claim 1 wherein
said radiative heating element emits radiation of a temperature as high as 3000° C.

5. The apparatus of claim 4 wherein
said radiative heating element comprises a plurality of infrared lamps.

6. The apparatus of claim 5 wherein
said radiative heating element is cooled by a flow of coolant fluid over and about said lamps.

7. The apparatus of claim 6 wherein
said coolant fluid comprises air.

8. The apparatus of claim 1 wherein
said heat sink comprises a substantially flat plate cooled by a flow of liquid coolant therethrough.

9. The apparatus of claim 1 wherein
said attaching means comprises at least one vacuum line adapted for communication with a vacuum source, and
a single one of said semiconductor bodies being engageable and supportable by said vacuum line at one end thereof by differential pressure means, and
each of said vacuum lines terminates in a vacuum cup at said end engageable with said semiconductor bodies.

10. The apparatus of claim 9 wherein
each of said vacuum lines comprises a flexible portion in communication with said vacuum source and a rigid end portion slidably received within a vacuum line guide,
said vacuum line guides being movable by said second actuator, and
each of said vacuum cups being fixed to and communicating with said rigid end portion and biased toward a position occupied by a corresponding body of semiconductor material prior to its engagement with said vacuum cup.

11. The apparatus of claim 9 wherein
each of said vacuum cups is biased downwardly by a weight.

12. The apparatus of claim 10 and further including
a manifold adapted for applying a vacuum to said vacuum lines, each of said vacuum lines being in fluid communication with said manifold.

13. The apparatus of claim 12 wherein said manifold is fixed to a manifold support movable with said vacuum line guide by said second actuation means.

14. The apparatus of claim 1 wherein
said second actuation means comprises an actuator including a piston shaft operatively connected to said attaching means.

15. The apparatus of claim 1 wherein
said first storage means includes at least one supporting base having a plurality of guides extending from a major surface thereof, and
said guides serving to maintain the alignment of a stack of semiconductor bodies.

16. The apparatus of claim 15 wherein
said supporting base is biased toward said bodies of semiconductor material.

17. The apparatus of claim 15 and further including
means for separating said semiconductor bodies from each other, said separating means ensuring that said transferring means removes only a single semiconductor body at a time from each of said stacks to said work chamber.

18. The apparatus of claim 17 wherein
said separating means comprises at least one gas nozzle disposed in proximity to each of said stacks of semiconductor bodies and adapted for communication with a source of pressurized gas, and
said air nozzles being further adapted for directing a jet of gas at two or more bodies of semiconductor material moved from a single stack through said jet by said transferring means.

19. The apparatus of claim 1 wherein
said second storage means comprises a supporting base having a plurality of guides disposed thereon and,
said guides serving to maintain the alignment of a stack of semiconductor bodies.

20. The apparatus of claim 1 wherein
said third actuation means comprises an actuator having a piston shaft operatively connected to said attaching means.

21. The apparatus of claim 1 wherein
said third actuation means is operatively connected to said second actuation means and is selectively movable with said attaching means by said second actuation means.

22. The apparatus of claim 1 wherein
said fourth actuation means comprises an actuator having a piston rod operatively connected to said attaching means.

23. The apparatus of claim 22 wherein
said piston rod is connected to said attaching means through said third actuation means.

* * * * *